United States Patent
Kawasaki

(10) Patent No.: US 9,246,493 B2
(45) Date of Patent: Jan. 26, 2016

(54) LEVEL SHIFT CIRCUIT AND SEMICONDUCTOR DEVICE

(75) Inventor: Yoichi Kawasaki, Kawasaki (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 14/397,631

(22) PCT Filed: Aug. 1, 2012

(86) PCT No.: PCT/JP2012/069593
§ 371 (c)(1),
(2), (4) Date: Oct. 28, 2014

(87) PCT Pub. No.: WO2014/020724
PCT Pub. Date: Feb. 6, 2014

(65) Prior Publication Data
US 2015/0078096 A1 Mar. 19, 2015

(51) Int. Cl.
*H03K 19/01* (2006.01)
*H03K 19/0185* (2006.01)
(Continued)

(52) U.S. Cl.
CPC ........ *H03K 19/018521* (2013.01); *G11C 16/08* (2013.01); *G11C 16/12* (2013.01); *G11C 16/14* (2013.01); *G11C 16/30* (2013.01); *H03K 3/35613* (2013.01); *H03K 3/356104* (2013.01)

(58) Field of Classification Search
CPC ............... H03K 19/018521; H03K 3/356104; H03K 3/35613; H03K 3/356139; H03K 3/356113; H03K 5/06; H03K 3/356165; G11C 16/30; G11C 16/12; G11C 16/08; G11C 16/14
See application file for complete search history.

(56) References Cited

U.S. PATENT DOCUMENTS 6,580,411 B1 * 6/2003 Kubota et al. .................. 345/98
6,809,554 B2 10/2004 Wada
(Continued)

FOREIGN PATENT DOCUMENTS

JP 07-202650 A 8/1995
JP 08-051351 A 2/1996
(Continued)

OTHER PUBLICATIONS

International Search Report issued in PCT/JP2012/069593, dated Sep. 11, 2012, with English translation.
(Continued)

*Primary Examiner* — Richard Elms
*Assistant Examiner* — Ajay Ojha
(74) *Attorney, Agent, or Firm* — McDermott Will & Emery LLP

(57) ABSTRACT

A level shift circuit includes: a latch circuit (Q5, Q6, Q7, Q8) including first (Q5, Q7) and second (Q6, Q8) inverter circuits; a first input MOS transistor (Q1) operating in accordance with an input signal; a second input MOS transistor (Q2) operating in accordance with an inversion signal of the input signal; and a current-voltage control MOS transistor (Q9). The latch circuit (Q5, Q6, Q7, Q8) outputs a voltage having been converted from the input voltage in level. Each of the first and second input MOS transistors (Q1, Q2) receives the input signal at its gate terminal, and drives the latch circuit (Q5, Q6, Q7, Q8) in accordance with the input signal. The current-voltage control MOS transistor (Q9) is provided between the input MOS transistor (Q1, Q2) and the latch circuit (Q5, Q6, Q7, Q8), and is driven in accordance with an inversion operation of the latch circuit by receiving an input of the control voltage at its gate terminal.

5 Claims, 19 Drawing Sheets

(51) Int. Cl.
*H03K 3/356* (2006.01)
*G11C 16/08* (2006.01)
*G11C 16/12* (2006.01)
*G11C 16/14* (2006.01)
*G11C 16/30* (2006.01)

(56) References Cited

U.S. PATENT DOCUMENTS

| | | | |
|---|---|---|---|
| 7,091,748 B2 | 8/2006 | Wada | |
| 7,176,741 B2 | 2/2007 | Ishikawa et al. | |
| 2004/0056682 A1 | 3/2004 | Wada | |
| 2004/0227557 A1 | 11/2004 | Ishikawa et al. | |
| 2005/0036134 A1 | 2/2005 | Wada | |
| 2006/0033550 A1 | 2/2006 | Ishikawa et al. | |
| 2008/0062760 A1* | 3/2008 | Kim | 365/185.03 |
| 2011/0095804 A1* | 4/2011 | Kumar et al. | 327/333 |
| 2013/0076424 A1* | 3/2013 | Mohammad et al. | 327/263 |
| 2014/0211572 A1* | 7/2014 | Bartling et al. | 365/189.08 |

FOREIGN PATENT DOCUMENTS

| | | |
|---|---|---|
| JP | 2000-187994 A | 7/2000 |
| JP | 2004-112666 A | 4/2004 |
| JP | 2004-153446 A | 5/2004 |
| JP | 2004-343396 A | 12/2004 |
| JP | 2009-253529 A | 10/2009 |

OTHER PUBLICATIONS

Japanese Notice of Grounds of Rejection issued in Application No. 2014-527894 mailed Jun. 9, 2014, with English Translation.

* cited by examiner (A)

| MODE | READ | WRITE | DELETE |
|---|---|---|---|
| Word Line | 4〜5V | 7〜11V | -4〜-10V |
| Bit Line | 0.8〜1.0V | 4〜5V | 0V |
| Source Line (BackGate) | 0V | 0V | 5〜10V |

FIG.15

| MODE | READ | WRITE | DELETE |
|---|---|---|---|
| MG Line | 0V | 7〜11V | -4〜-8V |
| CG Line | 1.5V | 1.1V | 0V |
| Bit Line | 0.8〜1.0V | 0.6〜0.8V | 0V |
| Source Line | 0V | 4〜5V | 5〜7V |

LEVEL SHIFT CIRCUIT AND SEMICONDUCTOR DEVICE

RELATED APPLICATIONS

This application is the U.S. National Phase under 35 U.S.C. §371 of International Application No. PCT/JP2012/069593, filed on Aug. 1, 2012, the disclosure of which Application is incorporated by reference herein.

TECHNICAL FIELD

The present invention relates to a level shift circuit, in particular, an art for reducing a layout area.

BACKGROUND ART

Electronic devices in recent years include circuits operating with various operation voltages, and achieves less power consumption and downsizing. For an operation of each of the electronic devices thus including the circuits different in operation voltage, a level shift circuit is employed to switch a voltage level of a logic signal.

Regarding the level shift circuit, for example, Japanese Patent Laying-Open No. 2004-343396 (Patent Document 1) discloses an art of handling penetration current generated when a PMOS (positive channel Metal Oxide Semiconductor) transistor and an NMOS (negative channel Metal Oxide Semiconductor) transistor are simultaneously turned on during transition in data input, the PMOS transistor and the NMOS transistor being disposed in series between a power supply and a ground in a level shift circuit. Japanese Patent Laying-Open No. 2004-112666 (Patent Document 2) discloses an art of preventing power consumption from being increased due to penetration current even when one of two power supply voltages supplied becomes unstable in a level shift circuit. Japanese Patent Laying-Open No. 2004-153446 (Patent Document 3) discloses an art of reducing an area occupied by a level shift circuit.

CITATION LIST

Patent Document

PTD1: Japanese Patent Laying-Open No. 2004-343396
PTD2: Japanese Patent Laying-Open No. 2004-112666
PTD3: Japanese Patent Laying-Open No. 2004-153446

SUMMARY OF INVENTION

Technical Problem

In a representative nonvolatile memory such as F-MONOS (metal-oxide-nitride-oxide-silicon), there has been known a method in which a latch type level shift circuit is employed for a decoder as means for feeding a word line, a bit line, or a source line with a voltage close to or more than the breakdown voltage of a transistor element. An exemplary shortcoming of such a latch type level shift circuit is a phenomenon such that a MOS transistor included in the latch passes penetration current to influence a latch inversion operation. In order to avoid such influence, the latch type level shift circuit employs a pull-down transistor having a relatively large size.

However, the pull-down transistor occupies a large area in the latch type level shift circuit. Moreover, when used for a decoder, a multiplicity of the same circuits need to be disposed. Accordingly, an art of attaining a small area of a latch type level shift circuit is needed.

Other objects and novel features will become apparent from the description of the present specification and the accompanied drawings.

Solution to Problem

A level shift circuit according to one embodiment includes: a latch circuit including first and second inverter circuits; a first input MOS transistor operating in accordance with an input signal; a second input MOS transistor operating in accordance with an inversion signal of the input signal; and a current-voltage control MOS transistor. The latch circuit employs, as an operation voltage, a voltage from a first voltage terminal fed with a first voltage and a second voltage terminal fed with a second voltage, and outputs a voltage having been converted from the input voltage in level. Each of the first and second input MOS transistors receives the input signal at its gate terminal, and drives the latch circuit in accordance with the input signal. The current-voltage control MOS transistor is connected between the first voltage terminal and the latch circuit, and suppresses penetration current in the latch circuit by controlling driving in accordance with an inversion operation of the latch circuit.

Advantageous Effects of Invention

According to the one embodiment described above, the level shift circuit can be constructed using a small pull-down transistor, thereby attaining a small area of latch type level shift circuit.

BRIEF DESCRIPTION OF DRAWINGS

FIG. 14 shows exemplary operation voltages for driving a word line, a bit line, and a source line of memory array 30 in flash module 2.

FIG. 15 shows exemplary operation voltages for driving a memory gate (MG), a control gate (CG), the bit line, and the source line.

DESCRIPTION OF EMBODIMENTS

Figure 1:
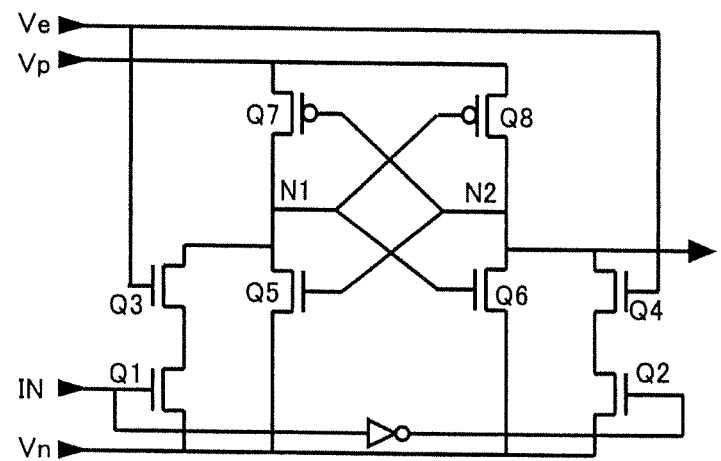
FIG. 1 shows the configuration of a latch type level shift circuit in a related art.

The following describes embodiments of the present invention with reference to figures. It should be noted that the same or corresponding portions in the figures are given the same reference characters and are not described repeatedly.

Related Art

First described is a related art for the purpose of comparison with the embodiments. In a product (such as a liquid crystal driver or a flash memory) handling a high voltage, there has been known a method of employing a latch type level shift circuit as means for feeding a word line, a bit line, or a source line with a voltage close to or more than the breakdown voltage of a transistor element.

FIG. 1 shows the configuration of the latch type level shift circuit in the related art.

As shown in FIG. 1, the latch type level shift circuit in the related art includes: a latch unit including four MOS transistors Q5, Q6, Q7, Q8 that receive operation voltages Vp, Vn and operate; N channel type input MOS transistors Q1, Q2 that receive an input signal IN and drive input nodes N1, N2 of the latch unit; and N channel type input cutting MOS transistors Q3, Q4 that are provided between input MOS transistor Q1 and input node N1 and between input MOS transistor Q2 and input node N2 of the latch unit and that operate to open/close in accordance with a control voltage Ve.

In the related art, for example, the following operation is performed when receiving input signal IN having a small amplitude and level-converting the input signal IN to a ground potential or a signal having a large amplitude such as boosted potential. In the related art, each of input MOS transistors Q1, Q2 is constructed as a pull-down transistor, and receives an input of logic by means of input signal IN. Since input cutting MOS transistors Q3, Q4 becomes electrically conductive in accordance with control voltage Ve, the input of logic received is latched to the latch unit. Thus, in this latch type level shift circuit, operation voltage Vp is made relatively low (about 5 V) and the latch is fixed with Vn=Vss voltage (ground potential). In the latch type level shift circuit, after input cutting MOS transistors Q3, Q4 are turned off by changing control voltage Ve after fixing the latch, operation voltage Vp is increased to a desired voltage, i.e., a boosted voltage (for example, Vp=11 V). In this latch type level shift circuit, when operation voltage Vp thus increased is a voltage that may exceed the breakdown voltage of the transistor element, the power supply voltage at the operation voltage Vn side is controlled to increase so as not to apply the voltage exceeding the breakdown voltage of the transistor element.

Figure 2:
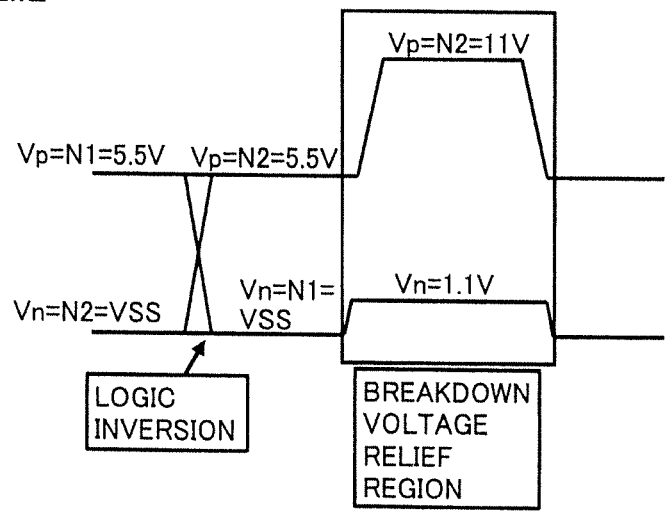
FIG. 2 shows an exemplary operation of the latch type level shift circuit in the related art.

FIG. 2 shows an exemplary operation of the latch type level shift circuit in the related art. It is assumed that the MOS transistor shown in the related art has a source-drain breakdown voltage of about 8 V to 10 V in the operation voltage. For this reason, in an example showing a "breakdown voltage relief region" in FIG. 2, operation voltage Vp is set at 11 V and operation voltage Vn is increased to 1.1 V such that a voltage exceeding the breakdown voltage of each transistor element is not fed to the MOS transistor included in the latch type level shift circuit.

In the related art, the latch inversion operation is hindered by penetration current flowing in each of N channel type MOS transistors Q5, Q6 included in the latch circuit. In order to address this, in the related art, the circuit is constructed using pull-down transistors (MOS transistors Q1, Q2) each having a large size.

However, such a pull-down transistor occupies the largest area among the various transistors included in the latch type level shift circuit. Furthermore, a multiplicity of the latch type level shift circuits are disposed in a device at a decoder unit and the like. For example, when used for a flash memory, the latch type level shift circuit may be disposed for each word line, thus greatly affecting a chip area.

First Embodiment

Next, the following describes a latch type level shift circuit according to a first embodiment in comparison to the related art of FIG. 1.

Figure 3:
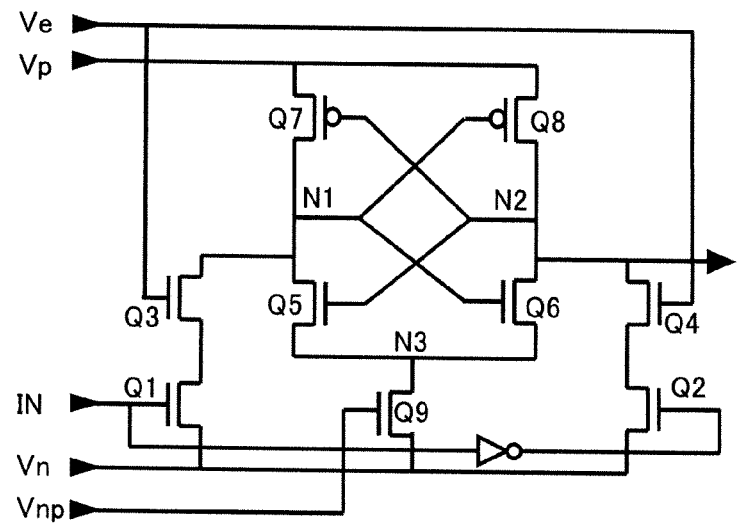
FIG. 3 shows the configuration of a latch type level shift circuit in a first embodiment.

FIG. 3 shows the configuration of the latch type level shift circuit in the first embodiment.

As shown in FIG. 3, the latch type level shift circuit includes: a latch unit including two inverters having inputs and outputs cross-coupled to each other between a voltage terminal fed with one operation voltage Vp and a predetermined node (N3); N channel type input MOS transistors Q1, Q2 that receive an input signal IN and drive input nodes N1, N2 of the latch unit; and N channel type input cutting MOS transistors Q3, Q4 that are provided between input MOS transistor Q1 and input node N1 and between input MOS transistor Q2 and input node N2 of the latch unit and that operate to open/close in accordance with a control voltage.

Furthermore, the latch type level shift circuit includes a current-voltage control MOS transistor Q9 connected between the predetermined node (N3) and a voltage terminal fed with the other operation voltage Vn.

One of the two inverters included in the latch unit is constructed of MOS transistors Q5, Q7 connected in series between the voltage terminal fed with operation voltage Vp and the predetermined node (N3). The other of the two inverters included in the latch unit is constructed of MOS transistors Q6, Q8 connected in series between the voltage terminal fed with operation voltage Vp and the predetermined node (N3).

Current-voltage control MOS transistor Q9 receives the control voltage at its gate terminal. MOS transistor Q9 is turned off during the inversion operation performed by the latch unit in accordance with input signal IN, thereby suppressing the penetration current. The level shift circuit has a plurality of voltage terminals via which operation voltages Vp, Vn and the like are applied.

With this configuration, the inversion in the latch unit is smoothly performed even though the driving ability of each of input MOS transistors Q1, Q2 is suppressed, whereby the latch type level shift circuit can be constructed using small pull-down transistors to contribute to attaining a small layout area.

Figure 4:
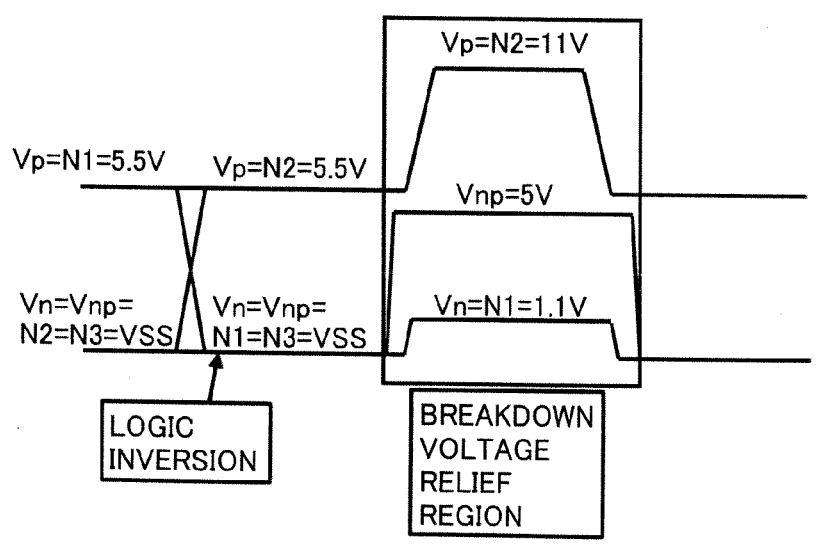
FIG. 4 shows an operation of the latch type level shift circuit of the first embodiment.

FIG. 4 shows an operation of the latch type level shift circuit of the first embodiment. It should be noted that operation voltage Vp, operation voltage Vn, control voltage Vnp, and the like applied to the latch type level shift circuit are controlled by a power supply control circuit provided separately from the latch type level shift circuit. For example, in the latch type level shift circuit, operation voltage Vp=about 5.5 V is first set to fix the input of logic provided by input signal IN in latch unit Q5, Q6, Q7, Q8. In the latch type level shift circuit, after fixing the latch, input cutting MOS transistors Q3, Q4 are turned off in accordance with the control voltage to increase operation voltage Vp to a desired voltage (for example, Vp=11 V).

When increasing an output voltage OUT, after the level conversion, to be equal to or more than the breakdown voltage of the transistor element, voltage Vn fed to the other voltage terminal becomes a breakdown voltage relief voltage (operation voltage Vn=1.1 V in the example of FIG. 4) before voltage Vp fed to the one voltage terminal is increased in the latch type level shift circuit. That is, in order to apply this breakdown voltage relief voltage to latch unit Q5, Q6, Q7, Q8, control voltage Vnp fed to current-voltage control MOS transistor Q9 is made equal to or more than a threshold voltage (Vth) of current-voltage control MOS transistor Q9. In the example of FIG. 4, by increasing control voltage Vnp to 5 V, the potential of node N3 and voltage Vn fed to the other voltage terminal are controlled to be substantially equal to each other.

Here, the breakdown voltage relief voltage refers to a voltage fed from the voltage terminal such that the voltage fed to the MOS transistor included in the latch unit does not exceed the breakdown voltage of the MOS transistor, i.e., a voltage fed therefrom to relieve the breakdown voltage.

In the example of FIG. 4, when operation voltage Vp=5.5 V, input signal IN is input to feed the input voltage to MOS transistor Q1, which is a pull-down transistor. On this occasion, the other operation voltage Vn=Vss, and a current to bring the voltage toward Vss flows by MOS transistor Q1, thereby entering into the latch inversion operation to decrease the level of node N1 from 5.5 V toward the ground potential.

During the inversion operation of latch unit Q5, Q6, Q7, Q8, node N2 is charged by P channel type MOS transistor Q8. On this occasion, a current in a path from node N2 to the other voltage terminal through N channel type MOS transistor Q6 and node N3 is suppressed by current-voltage control MOS transistor Q9 that receives Vss (ground potential) as the control voltage. In this way, voltage transition smoothly takes place between nodes N1, N2, which are nodes cross-coupled to each other. Accordingly, the latch type level shift circuit can be constructed using pull-down transistors Q1, Q2 smaller in current driving ability than those in the first related art, thereby reducing the layout area of the latch type level shift circuit.

Figure 5:
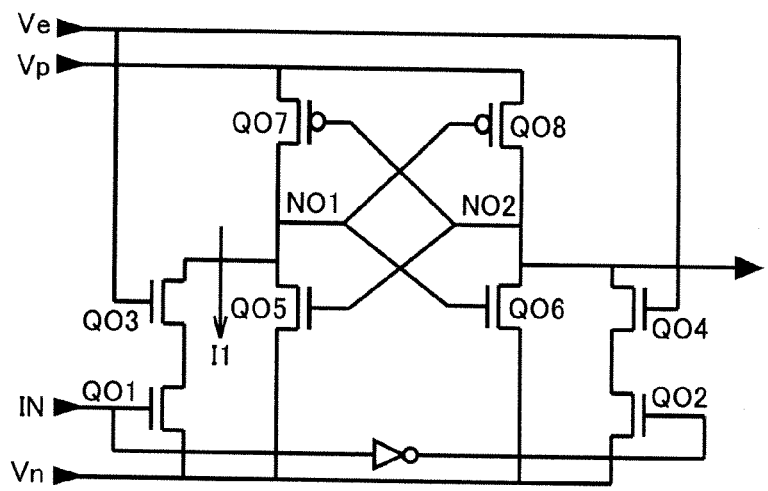
FIG. 5 shows penetration current flowing in the level shift circuit.
Figure 5:
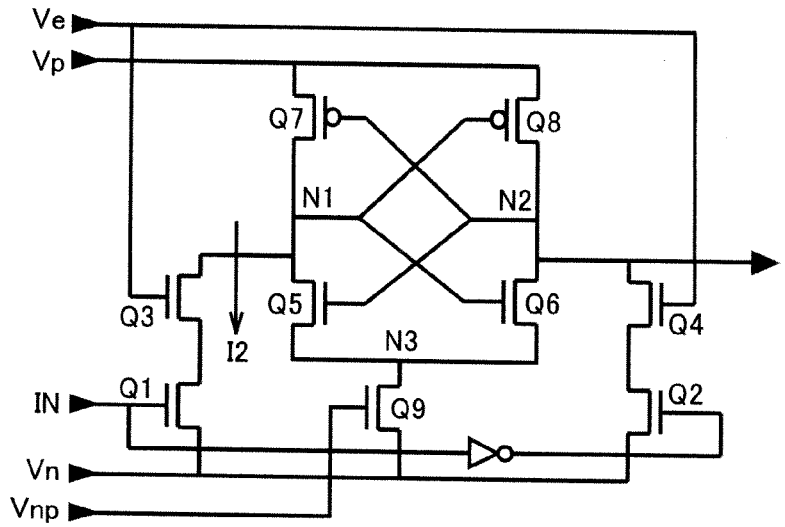

FIG. 5 shows the penetration current flowing in the level shift circuit. FIG. 5(A) shows the penetration current flowing in the level shift circuit in the related art. Penetration current I1 is current flowing in MOS transistor Q05 or Q06. FIG. 5(A) shows penetration current I1 in addition to the configuration of the related art illustrated in FIG. 1.

In comparison to the related art, FIG. 5(B) shows penetration current I2 flowing in the level shift circuit in the present embodiment. Penetration current I2 is current flowing in MOS transistor Q5 or Q6.

Figure 6:
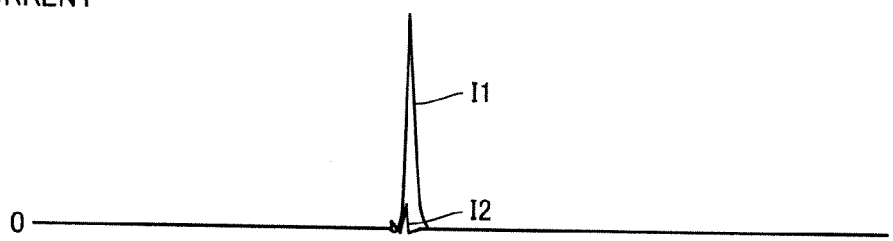
FIG. 6 shows exemplary latch inversion operations in the related art and the present embodiment.
Figure 6:
Figure 6:
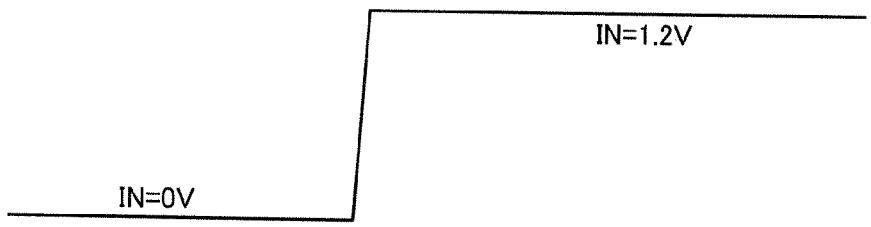

FIG. 6 shows exemplary latch inversion operations in the related art and the present embodiment. FIG. 6(A) shows a difference in penetration current between the related art and the present embodiment. FIG. 6(B) shows an exemplary operation of the level shift circuit. FIG. 6(C) shows a change in input signal. FIG. 6(A), FIG. 6(B), and FIG. 6(C) show the respective nodes (nodes NO1, NO2, N1, N2), input signal IN, and penetration currents I1, I2 shown in FIG. 5.

As shown in FIG. 6(C), in response to a change in input signal IN, the inversion operation is started in the latch circuit. In response to the change in input signal IN, as shown in FIG. 6(B), the potential of each of the nodes (nodes NO1, NO2, N1, N2) is switched. As shown in FIG. 6(A), large penetration current I1 is generated in the configuration of the related art, whereas in the present embodiment, penetration current I2 smaller than that in the related art is generated, thus decreasing the penetration current as compared with that in the related art.

Moreover, in the latch type level shift circuit, when the breakdown voltage relief voltage is applied in order to suppress excessive voltage application to the transistor included in the latch unit, a voltage of 1.1 V higher than Vn=Vss (ground potential) fed to the other voltage terminal with control voltage Vnp=5V is fed to the gate terminal of current-voltage control MOS transistor Q9 in the example of FIG. 4. Accordingly, the latch type level shift circuit can be operated so as not to hinder the breakdown voltage relief operation.

It should be noted that when applying the breakdown voltage relief voltage to the latch type level shift circuit, operation voltage Vn and control voltage Vnp may be applied in either order, but for stable operation of the circuit, it is desirable to apply control voltage Vnp and then apply operation voltage Vn.

Moreover, the latch type level shift circuit shown in FIG. 3 is configured such that one MOS transistor is provided between the latch unit and the other voltage terminal. However, the following configuration may be provided: a MOS transistor may be provided between each of the two inverters included in the latch unit and the other voltage terminal, i.e., between predetermined node N3 of each inverter and the other voltage terminal and a common control voltage is applied to the gate terminals of the two MOS transistors.

Figure 7:
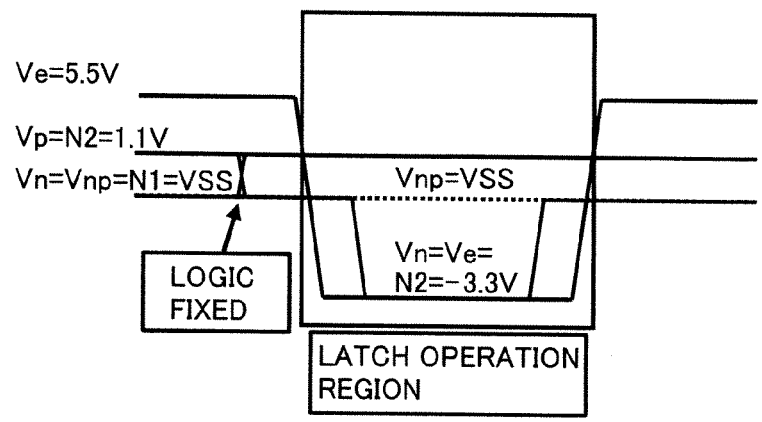
FIG. 7 shows an exemplary operation when operating in accordance with a negative voltage in the latch type level shift circuit of the first embodiment.

FIG. 7 shows an exemplary operation when operating in accordance with a negative voltage in the latch type level shift circuit of the first embodiment. Regarding the operation when applying a negative voltage, the same control is performed as that in the conventionally configured circuit shown in FIG. 1. Further, when applying a negative voltage, the operation is performed while input signal Vnp, which is added in the present invention, is always at 0 V.

Second Embodiment

Next, the following describes another embodiment with reference to figures.

Figure 8:
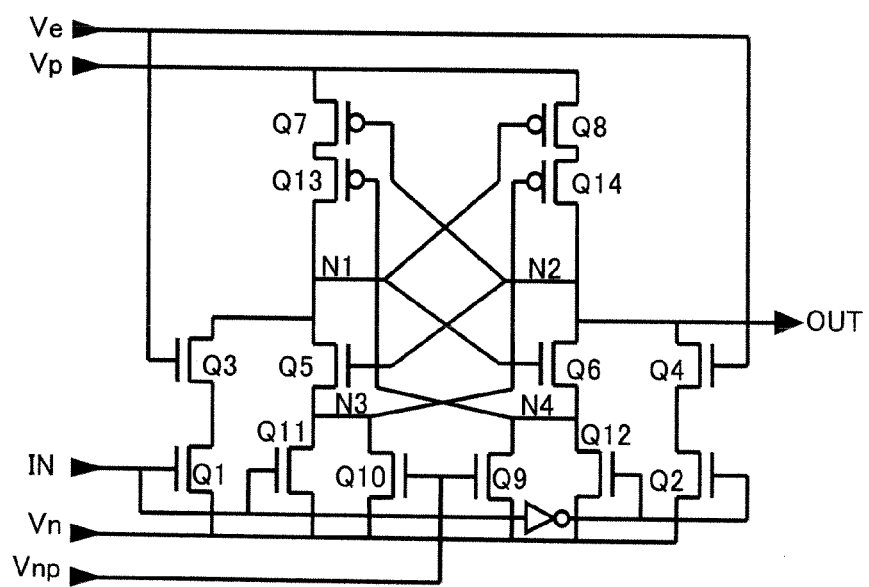
FIG. 8 shows the configuration of a latch type level shift circuit in a second embodiment.

FIG. 8 shows the configuration of a latch type level shift circuit in a second embodiment.

In comparison to the first embodiment, in the first embodiment, MOS transistor Q9 is turned off during the inversion operation of the latch unit so as to suppress the penetration current, and also serves as a MOS transistor for applying the breakdown voltage relief voltage to latch unit Q5, Q6, Q7, Q8. In the second embodiment, as the current-voltage control MOS transistor, the following MOS transistors are separately provided: a MOS transistor mainly playing a role in suppressing the penetration current; and a MOS transistor for applying the breakdown voltage relief voltage to latch unit Q5, Q6, Q7, Q8.

In the second embodiment, as shown in FIG. 8, the latch type level shift circuit includes: a latch unit including two inverters having inputs and outputs cross-coupled to each other between the voltage terminal fed with one operation voltage Vp and a predetermined node (N3, N4); N channel type input MOS transistors Q1, Q2 that receive input signal IN and drive input nodes N1, N2 of the latch unit; and N channel type input cutting MOS transistors Q3, Q4 that are provided between input MOS transistor Q1 and input node N1 and between input MOS transistor Q2 and input node N2 of the latch unit and that operate to open/close in accordance with a control voltage.

Furthermore, the latch type level shift circuit includes: MOS transistors Q10, Q11 connected between the predetermined node (N3) and the voltage terminal fed with the other operation voltage Vn; and MOS transistors Q9, Q12 connected between the predetermined node (N4) and the voltage terminal fed with the other operation voltage Vn.

One of the two inverters included in the latch unit includes MOS transistors Q5, Q7, Q13 connected in series between voltage terminal Vp fed with operation voltage Vp and the predetermined node (N3). P channel type MOS transistor Q13 having a gate terminal connected to the predetermined node (N4) plays an auxiliary role in the inversion operation.

The other of the two inverters included in the latch unit includes MOS transistors Q6, Q8, Q14 connected in series between voltage terminal Vp fed with operation voltage Vp and the predetermined node (N4). P channel type MOS transistor Q14 having a gate terminal connected to the predetermined node (N3) plays an auxiliary role in the inversion operation.

Each of MOS transistors Q9, Q10 receives the control voltage at its gate terminal. MOS transistors Q9, Q10 are turned off during the inversion operation performed by the latch unit in accordance with input signal IN. Moreover, N channel type MOS transistors Q11, Q12 are controlled in accordance with input signal IN.

N channel type MOS transistor Q11 or Q12 mainly plays a role in cutting the penetration current. In other words, N channel type MOS transistors Q11, Q12 operate in accordance with input signal IN, and suppress the penetration current resulting from the inversion operation of latch unit Q5, Q6, Q7, Q8.

As compared with the first embodiment, N channel type MOS transistors Q11, Q12 are controlled in accordance with input signal IN. Accordingly, the gates of P channel type MOS transistors Q13, Q14 can be controlled. Each of P channel type MOS transistors Q13, Q14 has a smaller parasitic capacitance than each of the voltages of nodes N1, N2 serving as the gate voltages of P channel type MOS transistors Q7, Q8, and is therefore fast in transition. Accordingly, in latch unit Q5, Q6, Q7, Q8, it plays a role in cutting the charge path from the P channel type MOS transistor in the discharge side node.

N channel type MOS transistors Q9, Q10 are MOS transistors mainly for applying the breakdown voltage relief voltage to latch unit Q5, Q6, Q7, Q8. When rendering operation voltage Vp high after fixing the latch, N channel type MOS transistors Q9, Q10 receive, via the gate terminals, control voltage Vnp equal to or more than a threshold voltage. Accordingly, operation voltage Vn is applied to latch unit Q5, Q6, Q7, Q8 via nodes N3, N4.

Of course, the change in control voltage provides the effect of reduction of the penetration current during the inversion operation, but in the latch type level shift circuit of FIG. 8, N channel type MOS transistor Q11 or Q12 provides a higher effect of reduction of the penetration current. In this second embodiment, MOS transistors Q10, Q11 connected in parallel between one inverter circuit included in the latch circuit and voltage terminal Vn suppress the penetration current through the one inverter circuit and relieve the breakdown voltage. Meanwhile, MOS transistors Q9, Q12 connected in parallel between the other inverter circuit included in the latch circuit and voltage terminal Vn suppress the penetration current through the other inverter circuit and relieve the breakdown voltage.

It should be noted that the exemplary operation is the same as that in the first embodiment.

With the configuration described above, the penetration current can be reduced, and depending on the threshold value, the operation voltage, and the like of each transistor, pull-down transistors Q1, Q2 can be further reduced in size as compared with the first embodiment.

Third Embodiment

Next, the following describes another embodiment with reference to figures.

Figure 9:
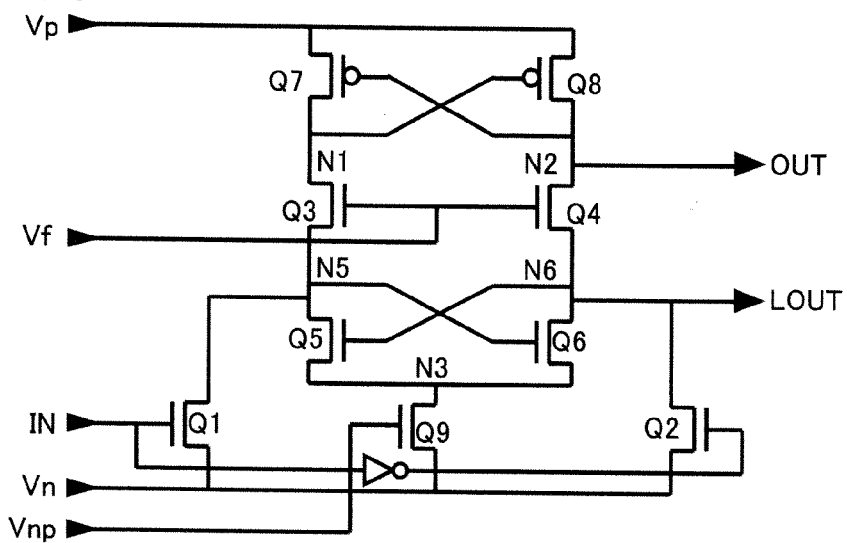
FIG. 9 shows the configuration of a latch type level shift circuit in a third embodiment.

FIG. 9 shows the configuration of a latch type level shift circuit in the third embodiment.

The third embodiment is different from the first embodiment in that the two inverters included in latch unit Q5, Q6, Q7, Q8 are divided by N channel type MOS transistors Q3, Q4 for breakdown voltage relief. One of the two inverters included in the latch unit includes MOS transistors Q5, Q7, Q3 connected in series between the voltage terminal fed with operation voltage Vp and predetermined node N3. N channel type MOS transistor Q3 serves to implement the breakdown voltage relief operation for the latch unit through voltage clamp. The other of the two inverters included in the latch unit includes MOS transistors Q6, Q8, Q4 connected in series between the voltage terminal fed with operation voltage Vp and predetermined node N3. Each of N channel type MOS transistors Q3, Q4 receives control voltage Vf at its gate terminal and operates. In the latch type level shift circuit of the third embodiment, the breakdown voltage relief operation is performed through the voltage clamp by applying a predetermined voltage to the gate terminals of MOS transistors Q3, Q4 each serving as an MOS for breakdown voltage relief. Thus, in the third embodiment, Q3, Q4, Q9 are MOS transistors mainly for current-voltage control, and MOS transistors Q3, Q4 mainly serve as MOS transistors for breakdown voltage relief. Moreover, MOS transistor Q9 mainly serves as a transistor for penetration current prevention.

Figure 10:
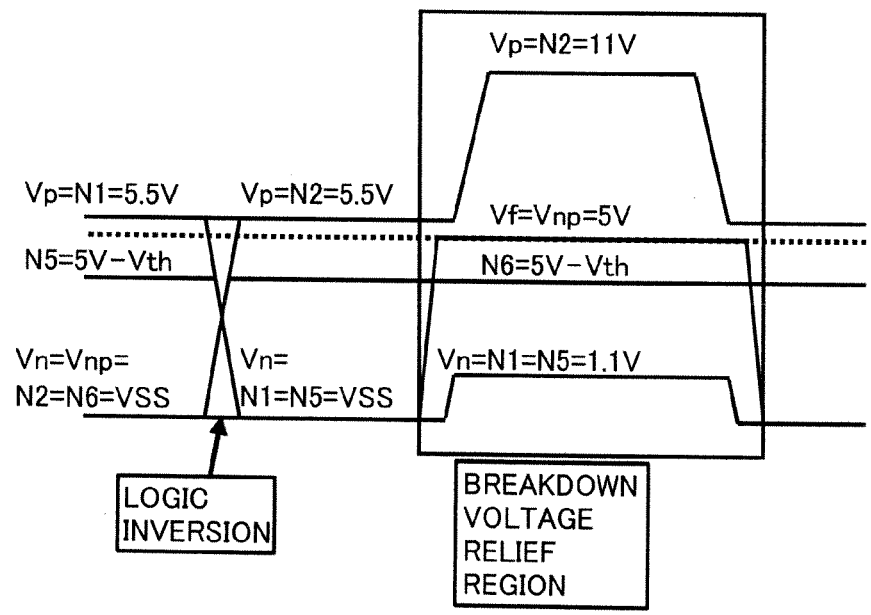
FIG. 10 shows an exemplary operation in the third embodiment.

FIG. 10 shows an exemplary operation in the third embodiment.

When a positive voltage is applied as control voltage Vf (control voltage Vf=5 V in the example of FIG. 10), operation voltage Vp is applied to nodes N1, N2 in the two inverters included in the latch unit. On the other hand, nodes N5, N6 are fed with a voltage clamped by control voltage Vf. In the example of FIG. 10, a voltage of (5 V−Vth) is applied to nodes N5, N6. During the breakdown voltage relief operation shown in FIG. 10, when operation voltage Vp is increased to a high voltage (for example, operation voltage Vp=11 V), node N5 or N6 is fed with the voltage clamped by N channel type MOS transistors Q3, Q4. In the example of FIG. 10, the clamped voltage (5 V-Vth) is applied to node N5 or N6.

With this configuration, application of voltage to the N channel type MOS transistor is relieved, thereby improving reliability of the N channel type MOS transistor (such as TDDB (Time Dependent Dielectric Breakdown)) or oxide film deterioration by FN (Fowler-Nordheim) tunneling). This is effective when the reliability of the N channel type MOS transistor is lower than that of the P channel type MOS transistor. Of course, as with the first embodiment, it is possible to control such that control voltage Vnp fed to MOS transistor Q9 becomes equal to or more than the threshold voltage (Vth) of current-voltage control MOS transistor Q9, control voltage Vnp is increased to 5 V, and potential of node N3 and voltage Vn fed to the other voltage terminal become substantially equal to each other. That is, it is also possible to feed the breakdown voltage relief voltage from the voltage terminal via MOS transistor Q9.

Fourth Embodiment

Next, the following describes another embodiment with reference to figures.

Figure 11:
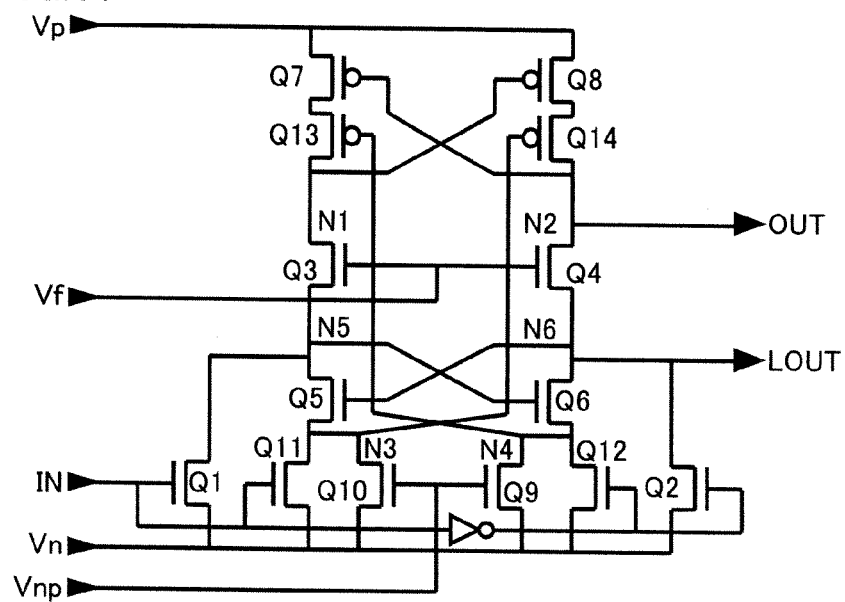
FIG. 11 shows the configuration of a latch type level shift circuit in a fourth embodiment.

FIG. 11 shows the configuration of the latch type level shift circuit in the fourth embodiment.

This configuration is obtained in the following manner N channel type MOS transistors Q3, Q4 for breakdown voltage relief as described in the third embodiment are added to the configuration of the second embodiment. The exemplary operation for breakdown voltage relief in the fourth embodiment is similar to the operation performed under the application of control voltage Vf as described in the third embodiment. In the fourth embodiment, MOS transistors Q3, Q4, Q9, Q10, Q11, Q12 serve as current-voltage control MOS transistors. Of these current-voltage control MOS transistors, MOS transistors Q11, Q12 play a role in suppressing the penetration current. Moreover, MOS transistors Q10, Q9, Q3, Q4 serve as MOS transistors for breakdown voltage relief. MOS transistors Q13, Q14 plays an auxiliary role in the latch inversion operation of the latch unit.

Exemplary Implementation of Latch Type Level Shift Circuit

While each of the embodiments has been thus described, the following describes an exemplary implementation of the latch type level shift circuit shown in each of the embodiments.

Figure 12:
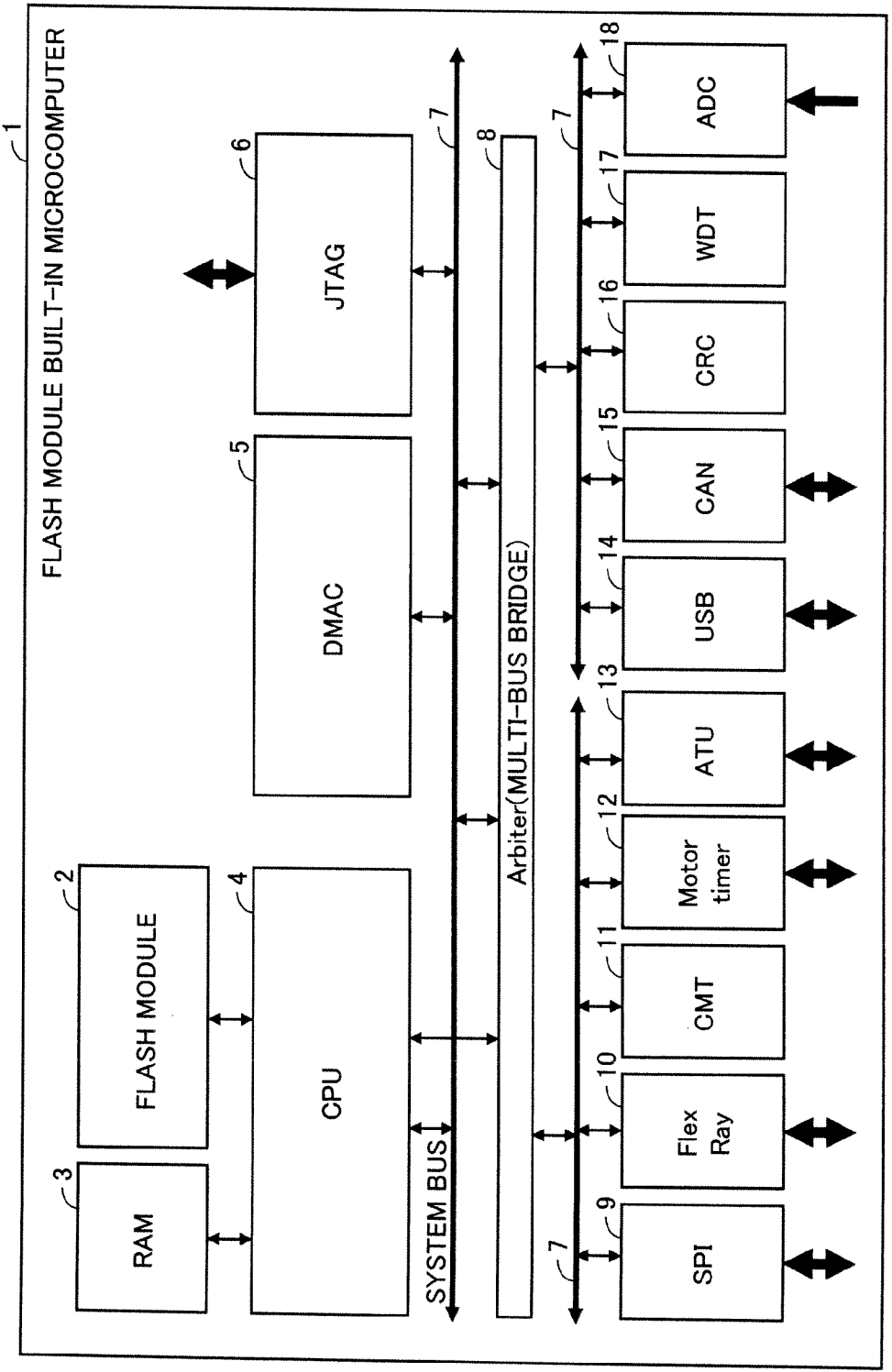
FIG. 12 shows the configuration of a flash module built-in microcomputer 1 including the latch type level shift circuit of each embodiment.

FIG. 12 shows the configuration of a flash module built-in microcomputer 1 including the latch type level shift circuit of the embodiment.

As shown in FIG. 12, flash module built-in microcomputer 1 includes a flash module 2, a RAM (Random Access Memory) 3, a CPU (Central Processing Unit) 4, a DMAC (Direct Memory Access Controller) 5, a JTAG (Joint Test Action Group) 6, a system bus 7, a multi-bus bridge 8, an SPI (Serial Peripheral Interface) 9, a FlexRay 10, a CMT (Concurrent Multipath Transfer) 11, a MotorTimer 12, an ATU (Automatic Antenna Tuner) 13, a USB (Universal Serial Bus) 14, a CAN (Controller Area Network) 15, a CRC (Cyclic Redundancy Check) 16, a WDT (Watchdog Timer) 17, and an ADC (Analog to Digital Converter) 18. For example, flash module built-in microcomputer 1 is a microcomputer used in a vehicle. The latch type level shift circuit of the embodiment is used in flash module 2.

Figure 13:
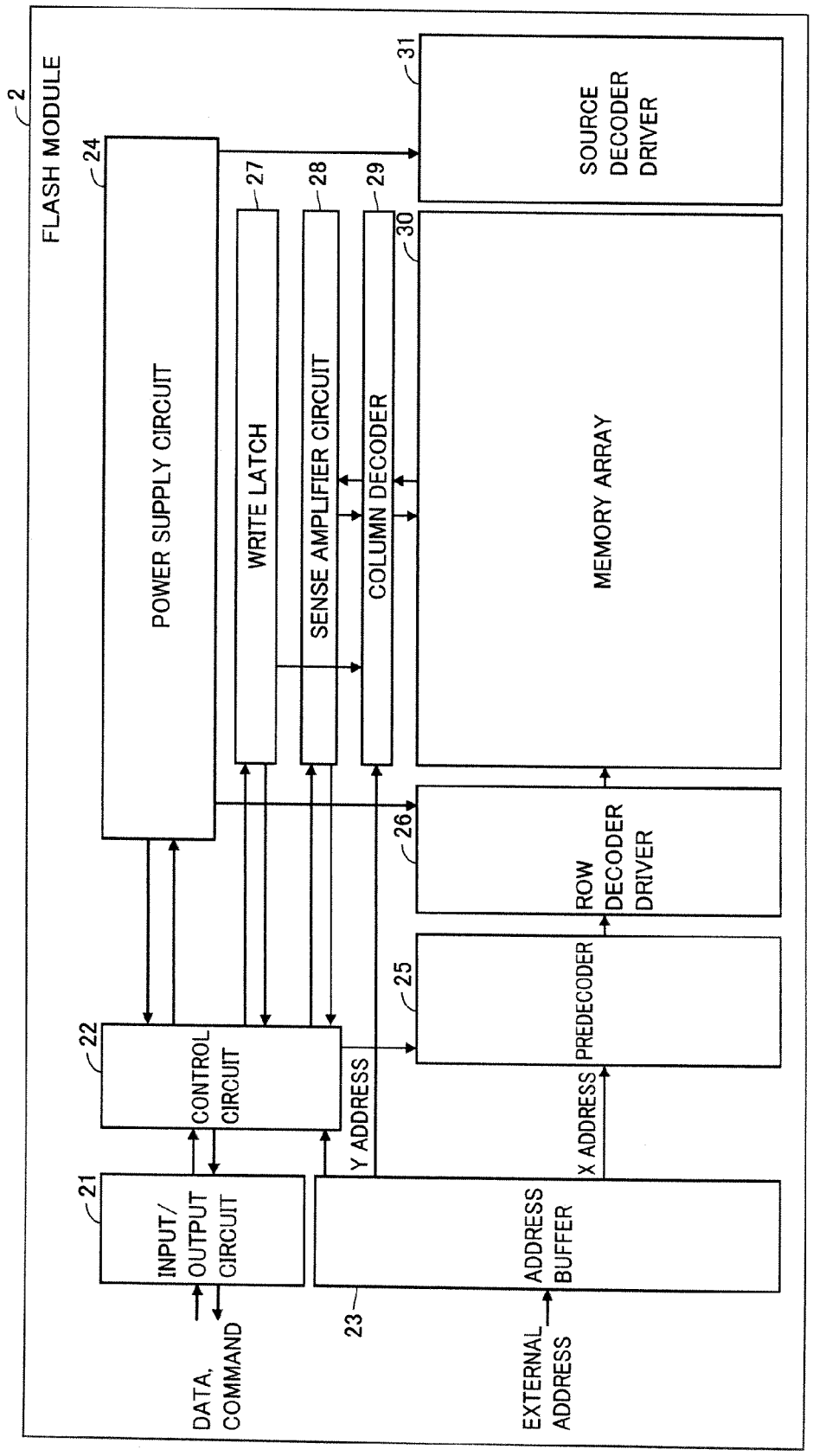
FIG. 13 shows the configuration of a flash module 2.

FIG. 13 shows the configuration of flash module 2 shown in FIG. 12.

As shown in FIG. 13, flash module 2 includes: an input/output circuit 21 for transmitting/receiving data or a command to/from an external device; a control circuit 22 for controlling each circuit in flash module 2; an address buffer 23 for retaining an address for access to memory array 30; a power supply circuit 24 for supplying voltage to each circuit in flash module 2; a predecoder 25 for predecoding the address for access to memory array 30; a row decoder driver 26 for decoding a row address and driving a word line; a write latch 27 for retaining data to be written in memory array 30; a sense amplifier circuit 28 for amplifying a signal; a column decoder 29 for decoding a column address; a memory array 30; and a source decoder driver 31 for driving a source line.

FIG. 14 shows exemplary operation voltages of the word line (WL), the bit line (BL), and the source line (SL) in each mode within the flash module employing a general stack gate type flash memory array.

FIG. 15 shows exemplary operation voltages of a memory gate (MG), a control gate (CG), the bit line, and the source line in each mode within a flash module employing an MONOS type flash memory array.

As shown in FIG. 14 and FIG. 15, various high voltages are used in flash module 2, and they need to be appropriately and selectively applied to memory cells. These various voltages are generated in power supply circuit 24 shown in FIG. 13.

The following describes an operation of flash module 2 including the latch type level shift circuit of the embodiment.

Figure 16:
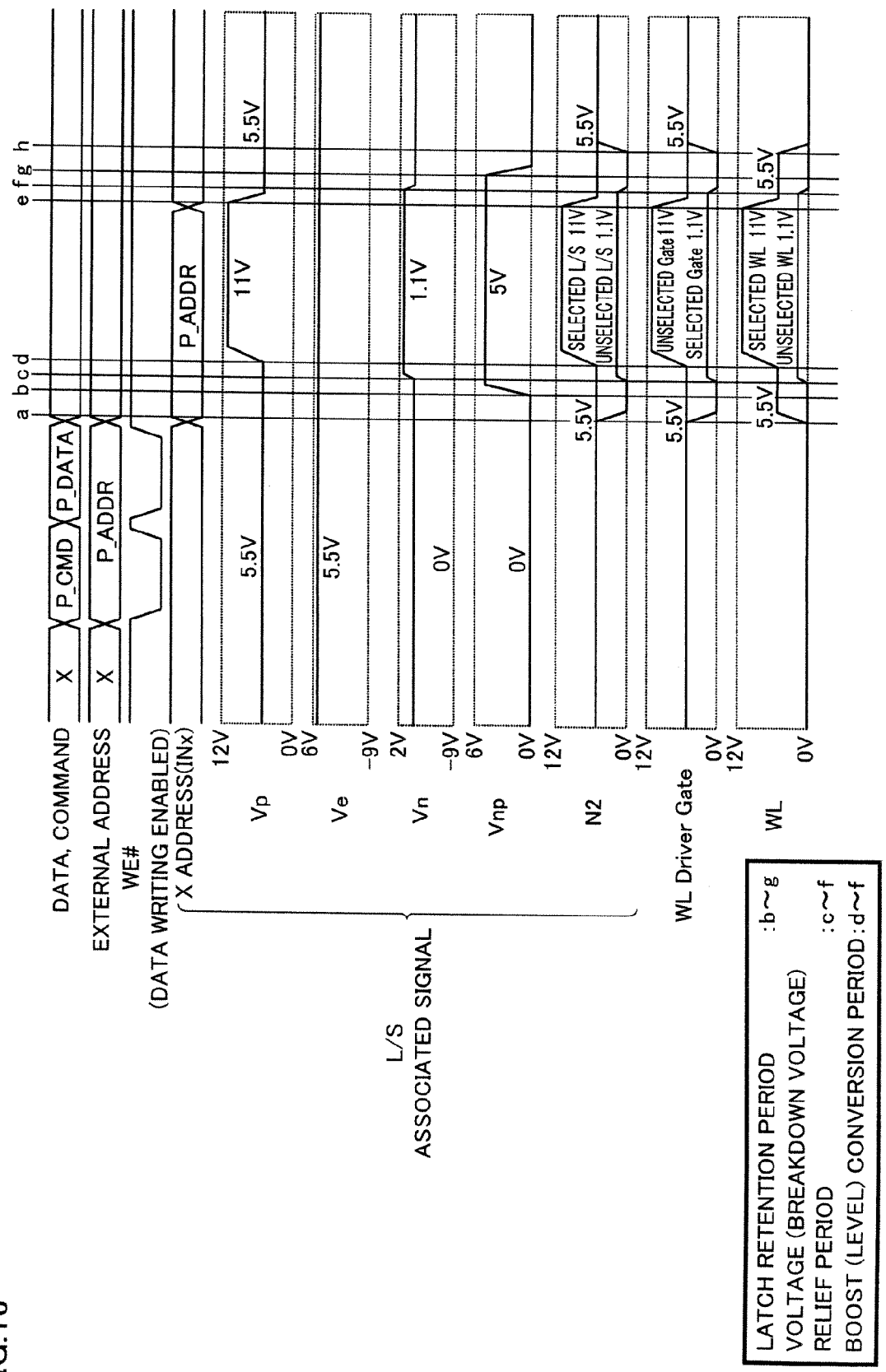
FIG. 16 shows waveforms during a rewriting operation of the flash module mainly with regard to the operation of the latch type level shift circuit.

FIG. 16 shows waveforms during a rewriting operation of the flash module mainly with regard to the operation of the latch type level shift circuit applied to the row decoder. In the figure, an address signal taken in accordance with a signal WE# is decoded, and is input as the X address of the MG decoder at a time a (INx). In response to this, the inversion operation takes place in a level shifter to cause the inversion operation in a selected L/S (level shift circuit). At a timing of time b, breakdown voltage relief voltage Vnp is 5 V. At a timing of time c, Vn=1.1 V. At a timing of time d, transition is made to Vp=11 V. By this operation, a voltage of 8 V is applied to WL of the memory cell. After the application of pulse, at respective timings of times e, f, g and h, operations contrary to the operations performed at times d, c, b and a are performed, thereby implementing a shutdown operation. By performing the series of control, voltages such as the ones shown in FIG. 14 and FIG. 15 can be applied to the memory cells while taking into consideration the breakdown voltage of the L/S component transistor.

It should be noted that the control timings for input signal IN to the latch type level shift circuit and various operation voltages VpVnVnpVe are appropriately delayed and controlled mainly based on a change in X address (INx). In particular, IN input to the latch type level shift circuit is input to the level shifter circuit immediately after the change in (INx) at time a at which WL is activated and to change after passage of certain time (after performing operations at e, f, and g) from the change in (INx) at time f at which the activation of WL is ended.

Figure 17:
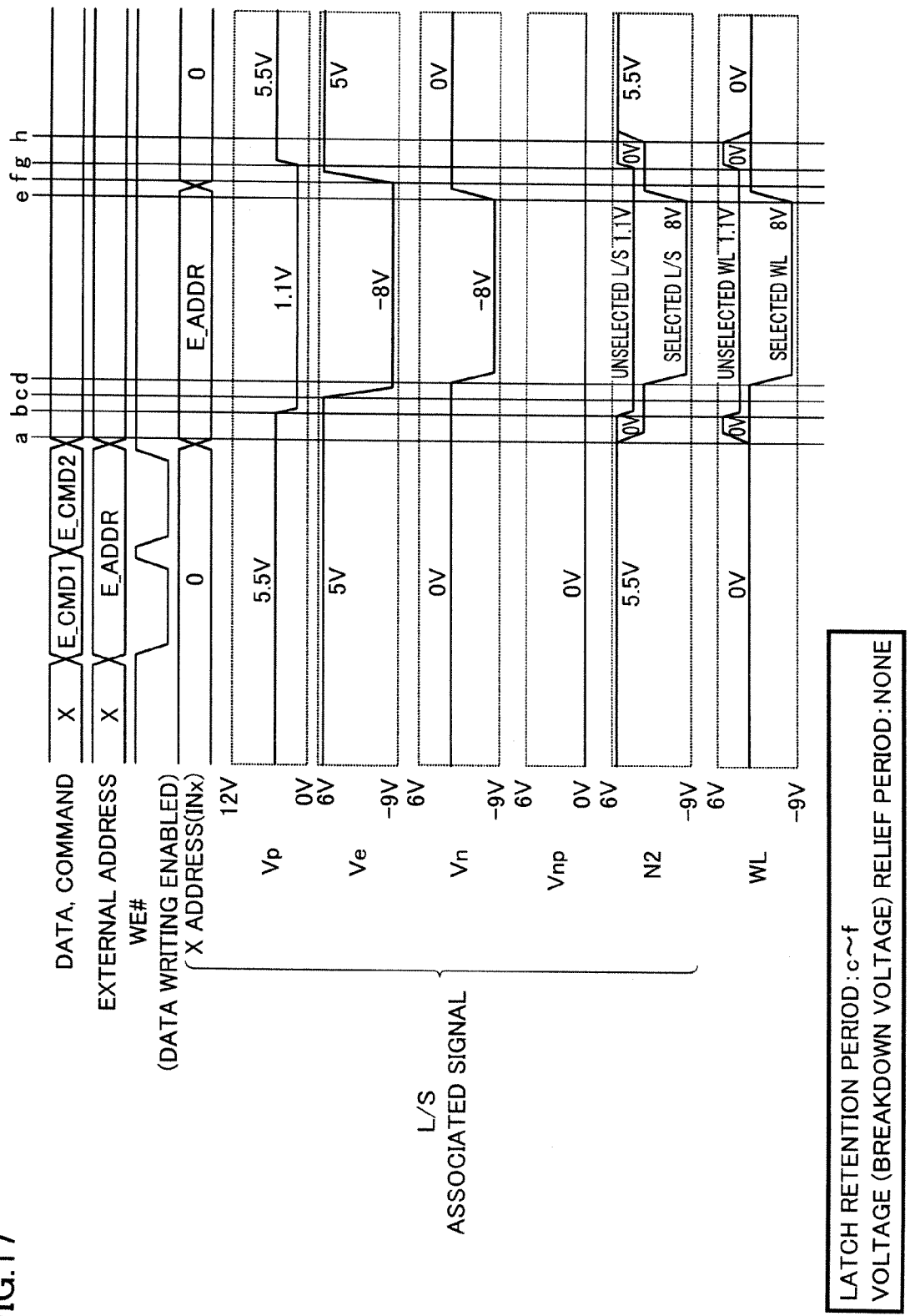
FIG. 17 shows waveforms during a deleting operation of the flash module mainly with regard to the operation of the latch type level shift circuit.

FIG. 17 shows waveforms during a deleting operation of the flash module mainly with regard to the operation of the latch type level shift circuit. In the figure, the address signal taken is decoded in accordance with a signal WE#, and is input as the X address of the MG decoder at a time a (INx). In response to this, the inversion operation takes place in a level shifter to cause the inversion operation in a selected L/S. At the timing of time b, the Vp voltage is 1.1 V for breakdown voltage relief. At the timing of time c, transition is made to Ve=−3.3 V in order to fix the address input at time a through the latch operation. At a timing of time d, transition is made to Vn=−8 V. By this operation, a negative voltage of −8 V is applied to WL of the memory cell. After the application of pulse, at respective timings of times e, f, g and h, operations contrary to the operations performed at times d, c, b and a are performed, thereby implementing a shutdown operation. By performing the series of control, voltages such as the ones shown in FIG. 14 and FIG. 15 can be applied to the memory cells while taking into consideration the breakdown voltage of the L/S component transistor.

Each of FIG. 16 and FIG. 17 shows a portion represented by "L/S associated signal" to illustrate the exemplary operation of the latch type level shift circuit (operation voltage Vp, operation voltage Ve, operation voltage Vn, control voltage Vnp, and node N2). "WL" indicates an exemplary operation of the word line.

Figure 18:
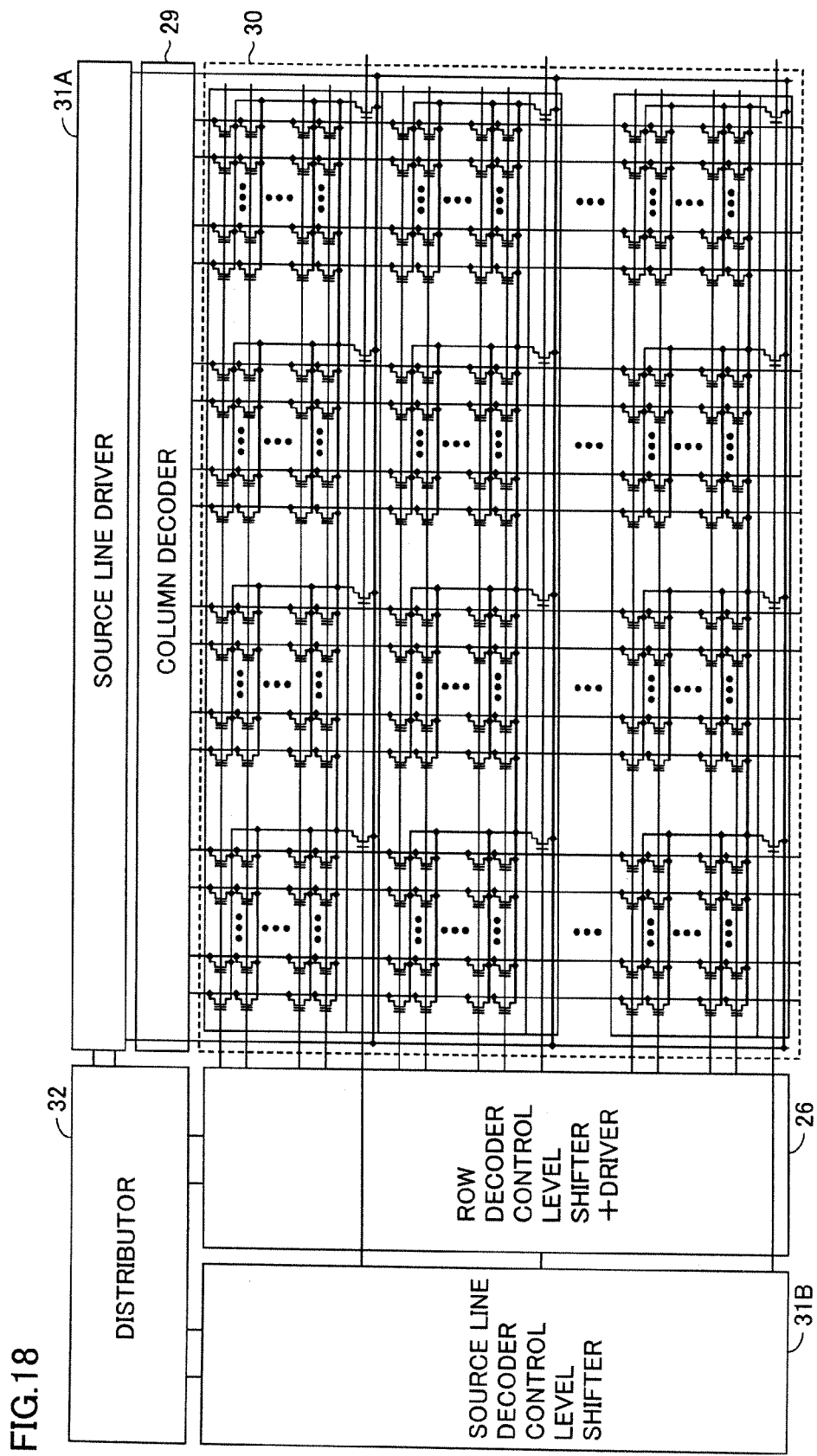
FIG. 18 shows a circuit around memory array 30 in flash module 2.

FIG. 18 shows a circuit around memory array 30 in flash module 2. It should be noted that FIG. 18 shows a portion including the latch type level shift circuit, so that the character string "control level shifter" is added to each block. Further, in FIG. 18, source decoder driver 31 of FIG. 13 is shown as a source line driver 31A and a source line decoder 31B. It should be noted that in FIG. 18, a distributor 32 controls output voltages to source line driver 31A and source line decoder 31B. Functionally, it can be said that distributor 32 is a part of power supply circuit 24 shown in FIG. 13.

Figure 19:
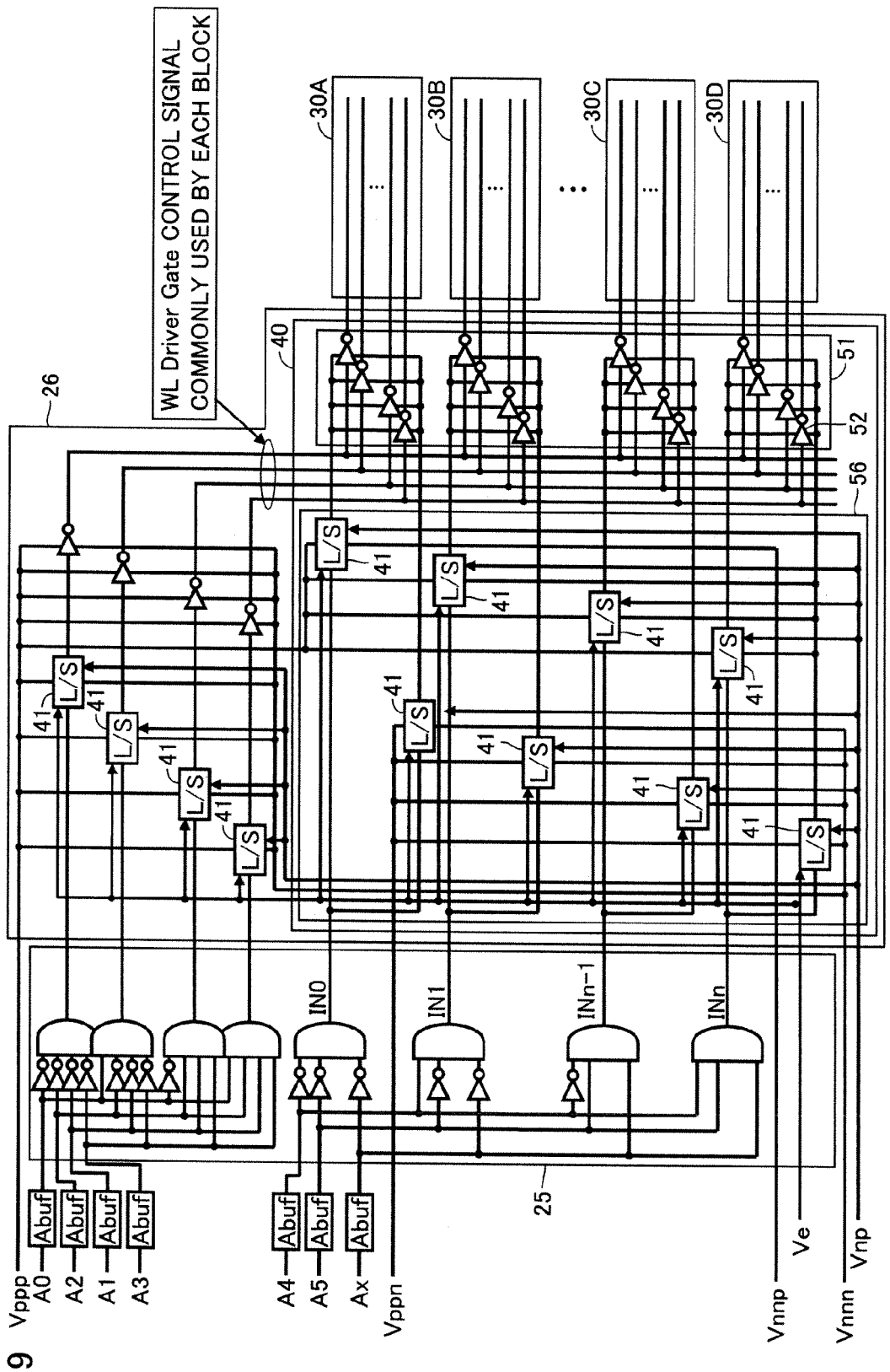
FIG. 19 shows an exemplary configuration around predecoder 25 and row decoder driver 26.

FIG. 19 shows an exemplary configuration around predecoder 25 and row decoder driver 26 in FIG. 13.

In the example of FIG. 19, predecoder 25 and row decoder driver 26 are shown. Row decoder driver 26 includes: an L/S zone 56 including a plurality of level shift circuits 41; and a word driver zone 51 including a plurality of word drivers 52. Moreover, L/S zone 56 and word driver zone 51 are shown as a level shift circuit and word driver zone 40. Further, in the example of FIG. 19, in order to reduce the number of the level shift circuits each having a large area, gate control for driving the word lines is collectively performed. Memory array 30 is divided into a plurality of blocks (blocks 30A, 30B, . . . ), and a common level shift circuit 41 is disposed for a plurality of word drivers 52 of each block. In this way, the number of level shift circuits 41 is determined according to a relation between the address decoding method and the word line driving circuit.

It should be noted that when paying attention to the word line driver of FIG. 19, the illustrative operation waveform diagram in FIG. 16 is associated with: WL, which is an output of the WL driver; the WL driver gate, which is an input of the inverter serving as the WL driver; and N2, which is at the Pch side operation voltage of the WL driver; and the like.

Figure 20:
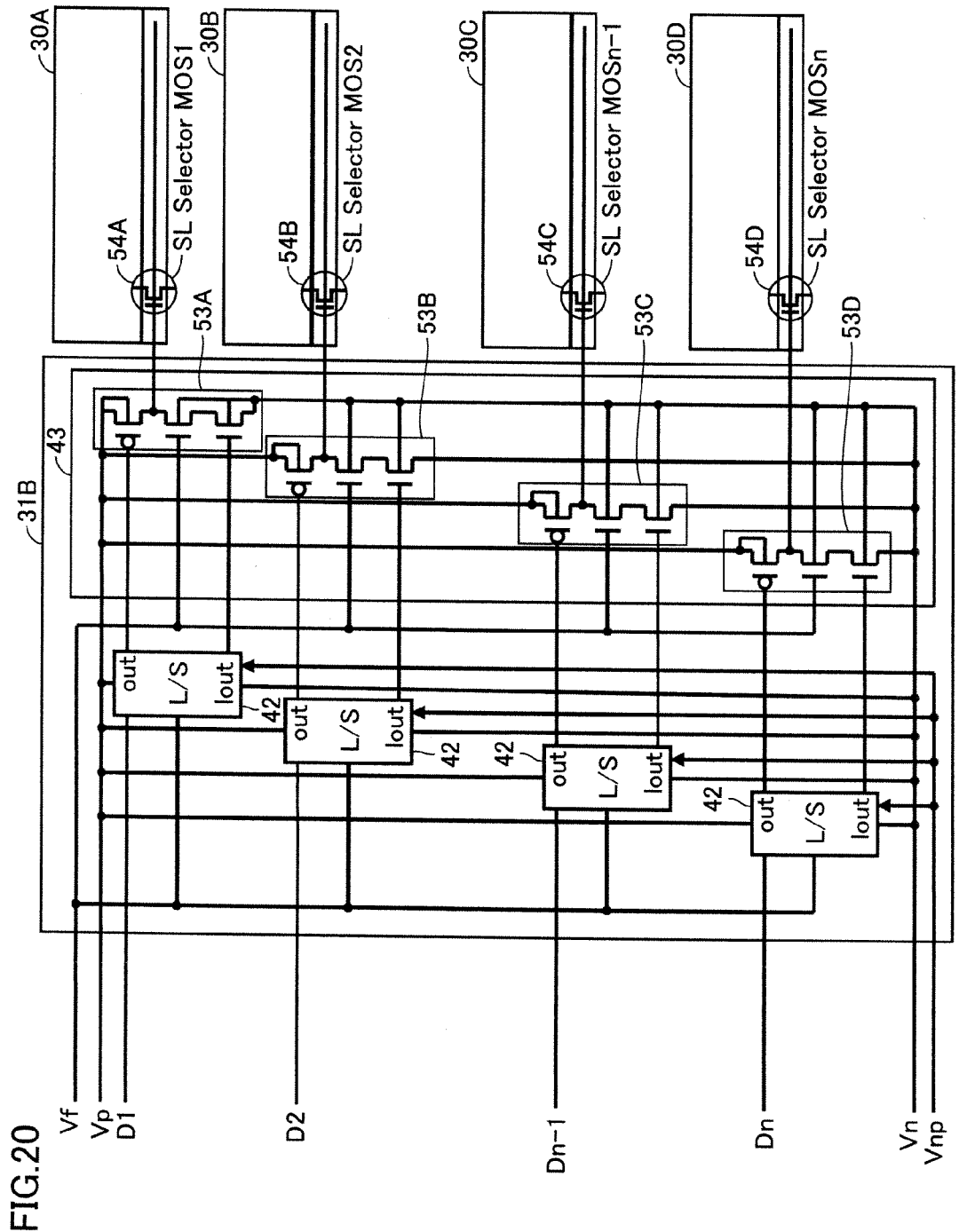
FIG. 20 shows an exemplary configuration of a source line decoder using the level shift circuit of the third or fourth embodiment.

FIG. 20 shows an exemplary configuration of the source line decoder employing the level shift circuit of the third or fourth embodiment.

Source line decoder 31B includes a level shift circuit 42 and a source line selection MOS gate driver zone 43. In the level shift circuit of the third or fourth embodiment, for the breakdown voltage relief, there are the following two types of output voltages: HIGH (OUT signal) and Low (LOUT signal). In order to protect the NMOS in the driver portion of source line selection MOS gate driver zone 43, an NMOS for breakdown voltage relief through control voltage Vf is also used for the driver portion.

The blocks (blocks 30A, 30b, . . . ) of memory array 30 and source line selection MOS gate drivers 53 (source line selection MOS gate driver 53A, source line selection MOS gate driver 53B, . . . ) correspond to one another respectively, and source line selection MOS 54 (source line selection MOS 54A, source line selection MOS 54B, . . . ) are turned on/off in accordance with the output of source line selection MOS gate driver 53. Each of address signals D1 to Dn indicates the address of an access destination in memory array 30, and is input as input signal IN of level shift circuit 42.

Figure 21:
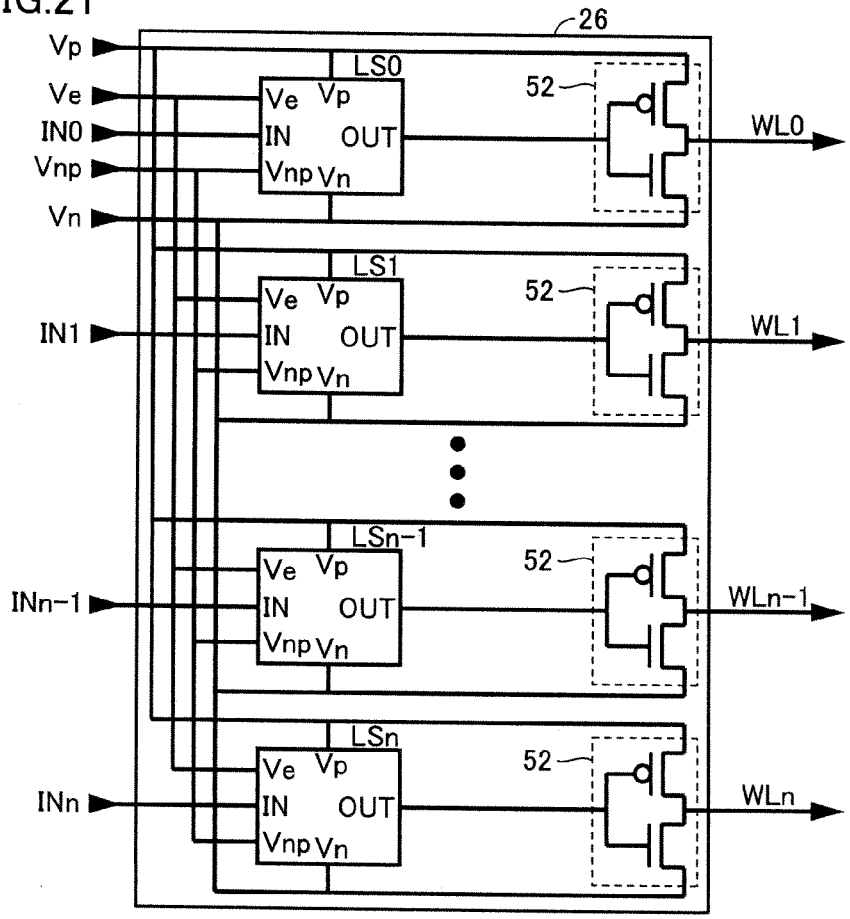
FIG. 21 shows an exemplary row decoder driver 26 constructed using the level shift circuit of the first embodiment.

FIG. 21 shows a modification of row decoder driver 26 configured using the level shift circuit of the first embodiment. In comparison to the case of FIG. 19, in this example, one word driver 52 is provided for one level shift circuit.

With such a configuration, high voltage and negative voltage can be selectively applied to a memory cell. Operation voltage Vp, operation voltages Vn, Ve, control voltage Vnp, and the like can be commonly used in the decoder, so that it is not necessary to perform decoding at a high voltage.

Figure 22:
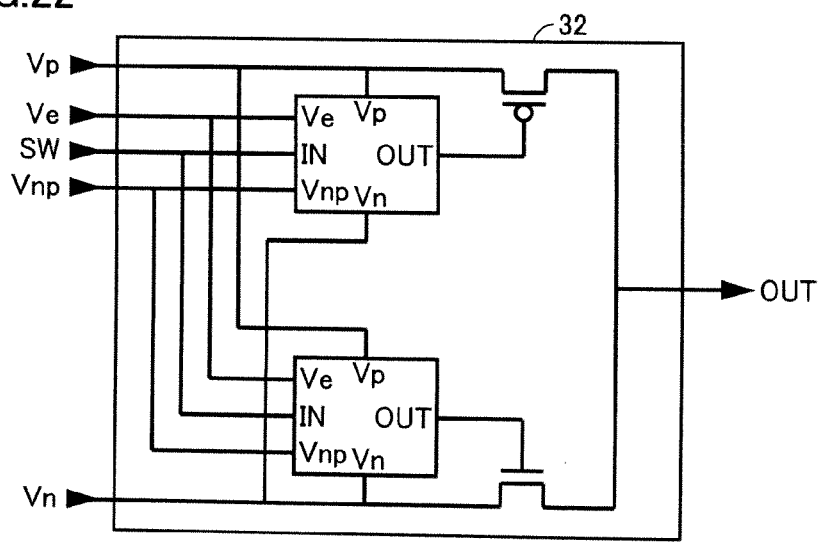
FIG. 22 shows an exemplary distributor 32 constructed using the level shift circuit of the first embodiment.

FIG. 22 shows an example of distributor 32 configured using the level shift circuit of the first embodiment.

With such a configuration, a distributor having a small layout area can be formed.

Comparison with Related Art in Layout Area

The description below provides a comparison in layout area by showing an exemplary layout of the latch type level shift circuit in the related art and an exemplary layout of the latch type level shift circuit of each of the embodiments.

Figure 23:
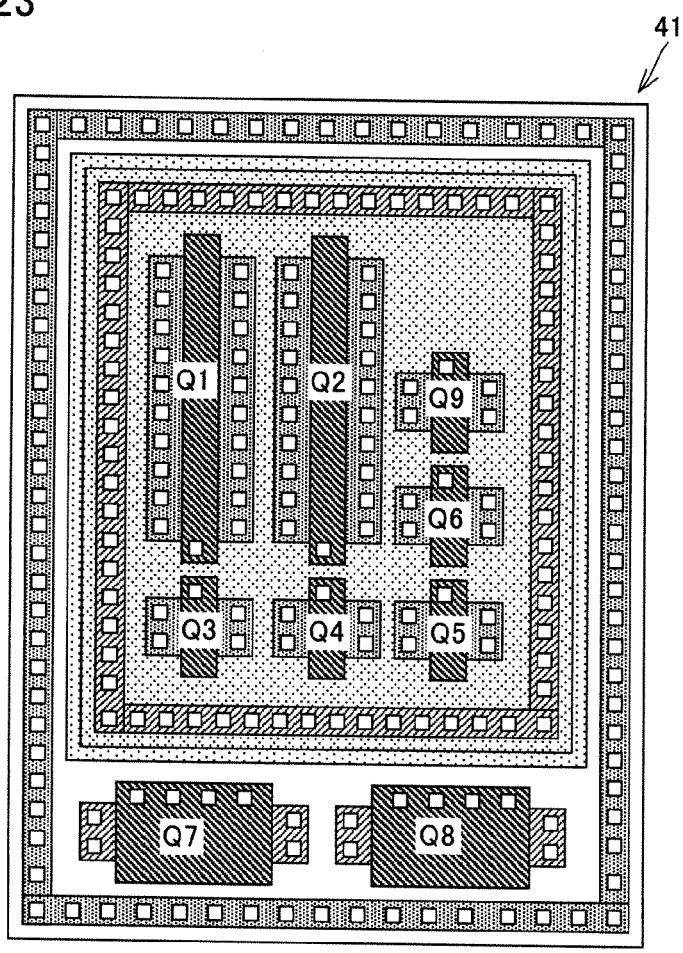
FIG. 23 shows an exemplary layout 41 of the latch type level shift circuit shown in the first embodiment.

FIG. 23 shows an exemplary layout 41 of the latch type level shift circuit shown in the first embodiment. In FIG. 23, "Q1" and the like respectively correspond to the MOS transistors shown in FIG. 5.

Figure 24:
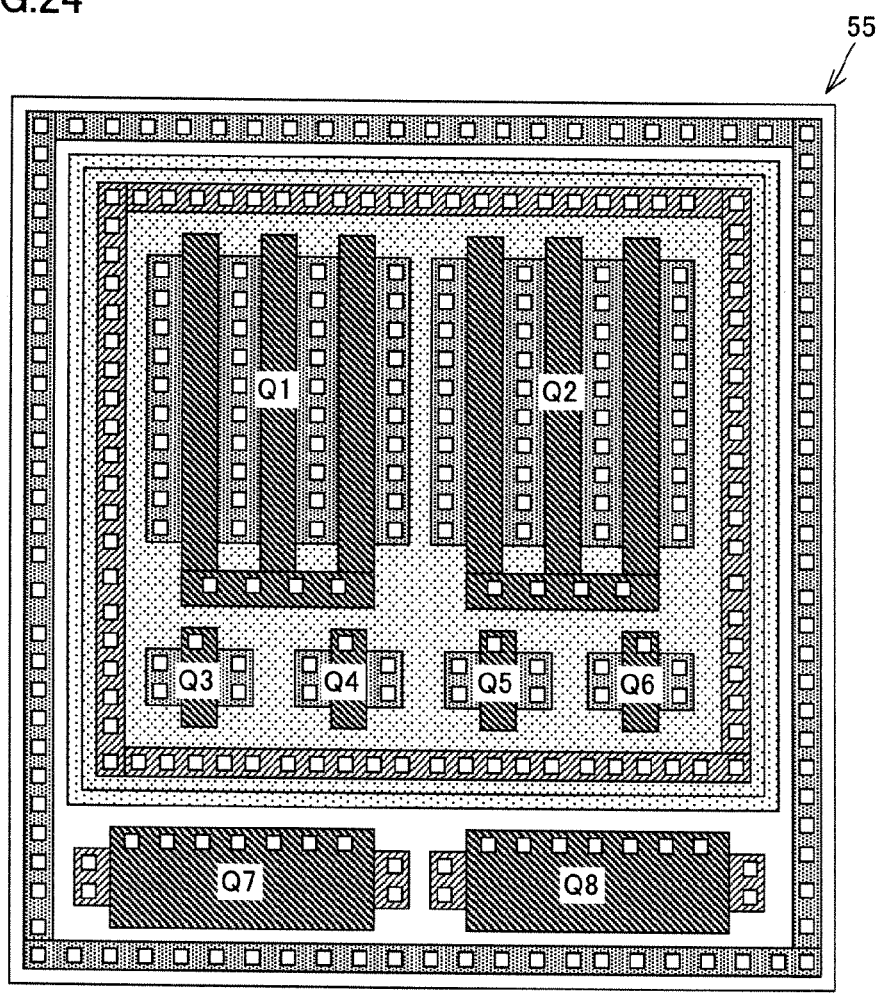
FIG. 24 shows an exemplary layout 55 of the latch type level shift circuit shown in the related art.

FIG. 24 shows an exemplary layout 55 of the latch type level shift circuit shown in the related art. Exemplary layout 55 corresponds to the latch type level shift circuit shown in FIG. 1.

In comparison between FIG. 23 and FIG. 24, for example, it is indicated that each pull-down transistor (Q1, Q2) can be implemented to have a small layout area in the latch type level shift circuit shown in the first embodiment.

Figure 25:
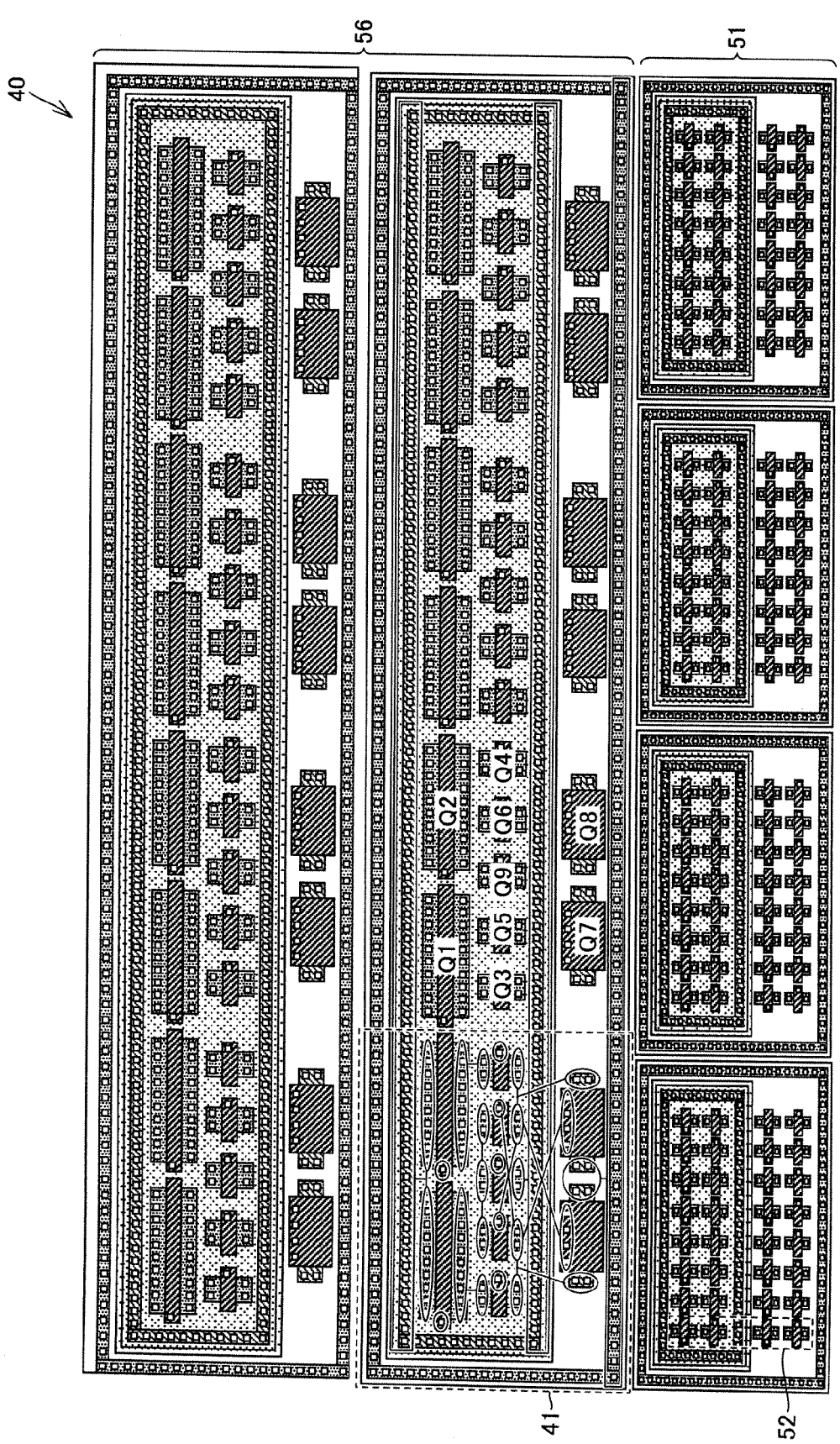
FIG. 25 shows an exemplary layout of the row decode circuit using the latch type level shift circuit shown in the embodiment.

FIG. 25 shows an exemplary layout of a row decode circuit using the latch type level shift circuit shown in the embodiment. FIG. 25 also shows exemplary wiring in each MOS transistor. It should be noted that FIG. 25 shows an exemplary layout of level shift circuit and word driver zone 40 shown in FIG. 19. A plurality of level shift circuits 41 are included in L/S zone 56. Moreover, a plurality of word drivers 52 are included in word driver zone 51.

As such, in FIG. 25, when an array pitch of the memory arrays is made the same, the layout area can be reduced by about 40% in the longitudinal direction even only around the row decoder as compared with the case where the related art is used. Hence, when the present embodiment is applied to a multiplicity of level shift circuits used in the flash module, the layout area can be greatly reduced as compared with the related art. Moreover, in the entire chip, the flash module occupies a relatively large ratio of area in the entire chip, so that the downsizing of the level shift circuit also greatly contributes to reduction of the entire area of the chip.

It should be noted that the figures mentioned above mainly and particularly illustrate the portion corresponding to the level shift circuit.

Each of the embodiments has been thus described, but these embodiments may be combined with each other. Moreover, in each of the embodiments, the reduction of current is attained by means of the N channel type MOS transistor (Q9 in the first embodiment or the like) provided between operation voltage Vn and the predetermined node of the latch circuit, but the present invention is not limited to the NMOS transistor and the type of each MOS transistor may be changed in such a manner that the P channel type is changed to the N channel type or the N channel type is changed to the P channel type. Moreover, there may be employed a configuration in which operation voltage Vn and operation voltage Vp are replaced with each other.

Heretofore, the invention made by the present inventor has been specifically described based on the embodiments, but the present invention is not limited to the embodiments and can be changed in various ways within its range without departing from the gist thereof.

REFERENCE SIGNS LIST

1: flash module built-in microcomputer; 2: flash module; 3: RAM; 4: CPU; 5: DMAC; 6: JTAG; 7: system bus; 8: multi-bus bridge; 9: SPI; 10: FlexRay; 11: CMT; 12: MotorTimer; 13: ATU; 14: USB; 15: CAN; 16: CRC; 17: WDT; 18: ADC; 21: input/output circuit; 22: control circuit; 23: address buffer; 24: power supply circuit; 25: predecoder; 26: row decoder driver; 27: write latch; 28: sense amplifier circuit; 29: column decoder; 30: memory array; 31: source decoder driver; 31A: source line driver; 31B: source line decoder; 32: distributor; 40: level shift circuit and word driver zone; 41: level shift circuit; 42: level shift circuit; 43: source line selection MOS gate driver; 51: word driver zone; 52: word driver; 53: source line selection MOS gate driver; 54: source line selection MOS; 55: level shift circuit; 56: L/S zone.

The invention claimed is:

1. A level shift circuit comprising:
a first voltage terminal fed with a first voltage;
a second voltage terminal fed with a second voltage;
a latch circuit including a first inverter circuit and a second inverter circuit, said first inverter circuit being connected between said second voltage terminal and a first node, said second inverter circuit being connected between said second voltage terminal and a second node, said first and second inverter circuits having input terminals and output terminals cross-connected to each other;
a first input MOS transistor, connected between said first voltage terminal and said input terminal of said first inverter circuit, for receiving an input signal at its gate terminal and driving said latch circuit in accordance with said input signal;
a second input MOS transistor, connected between said first voltage terminal and said input terminal of said second inverter circuit, for receiving an inversion signal of said input signal at its gate terminal and driving said latch circuit in accordance with said input signal; and
at least one current-voltage control MOS transistor, connected between said first node and said first voltage terminal and between said second node and said first voltage terminal, for suppressing penetration current in said latch circuit by controlling driving in accordance with an inversion operation of said latch circuit,
wherein said first node and said second node are connected to each other, and said current-voltage control MOS transistor is provided to be common to said first and second inverter circuits,
wherein in said latch circuit, a first breakdown voltage relief NMOS transistor is connected between a first PMOS transistor and a first NMOS transistor included in said first inverter circuit, a second breakdown voltage relief NMOS transistor is connected between a second PMOS transistor and a second NMOS transistor included in said second inverter circuit, and in said level shift circuit, by applying a first control voltage to a gate terminal of each of said first and second breakdown voltage relief NMOS transistor, a clamped voltage is input to said latch circuit as a breakdown voltage relief voltage, and
wherein the first control voltage is higher than a second control voltage applied to a gate terminal of the current-voltage control MOS transistor in a first operation, and the first control voltage is lower than the second control voltage applied to the gate terminal of the current-voltage control MOS transistor in a second operation.

2. The level shift circuit according to claim 1, wherein in said level shift circuit, the second control voltage is equal to or less than a threshold value during the latch inversion operation of said latch circuit, and the second control voltage is equal to or more than the threshold value during a retention period of said latch circuit.

3. The level shift circuit according to claim 1, wherein in said level shift circuit, during a retention period of said latch circuit, the voltage supplied to said first voltage terminal is set at a predetermined voltage level so as to apply a breakdown voltage relief voltage from said current-voltage control MOS transistor to said latch circuit.

4. The level shift circuit according to claim 1, wherein the first operation is an operation of writing data in memory cells, and the second operation is an operation of deleting data from the memory cells.

5. The level shift circuit according to claim 1, wherein the first control voltage is lower than a ground potential in the second operation.

* * * * *